United States Patent
Torii et al.

(10) Patent No.: US 7,880,222 B2
(45) Date of Patent: Feb. 1, 2011

(54) SEMICONDUCTOR DEVICE HAVING PLURAL REGIONS AND ELEMENTS WITH VARYING AREAS DEPENDING ON THE REGION

(75) Inventors: Katsuyuki Torii, Niiza (JP); Masaki Kanazawa, Niiza (JP)

(73) Assignee: Sanken Electric Co., Ltd. (JP)

( * ) Notice: Subject to any disclaimer, the term of this patent is extended or adjusted under 35 U.S.C. 154(b) by 340 days.

(21) Appl. No.: 11/587,881

(22) PCT Filed: Feb. 17, 2006

(86) PCT No.: PCT/JP2006/302887
§ 371 (c)(1),
(2), (4) Date: Oct. 27, 2006

(87) PCT Pub. No.: WO2006/088161
PCT Pub. Date: Aug. 24, 2006

(65) Prior Publication Data
US 2008/0247148 A1 Oct. 9, 2008

(30) Foreign Application Priority Data
Feb. 21, 2005 (JP) ............................ 2005-044676

(51) Int. Cl.
*H01L 29/66* (2006.01)
(52) U.S. Cl. .................. 257/328; 257/355; 257/678
(58) Field of Classification Search .............. 257/678, 257/328, 355
See application file for complete search history.

(56) References Cited

U.S. PATENT DOCUMENTS 4,199,774 A    4/1980   Plummer
4,532,534 A    7/1985   Ford et al.

(Continued)

FOREIGN PATENT DOCUMENTS

JP    55-111151 A    8/1980

(Continued)

OTHER PUBLICATIONS

Office Action of JP Application No. 2005-044676, mailed Apr. 1, 2008 [with English Translation].

(Continued)

*Primary Examiner*—Thao X Le
*Assistant Examiner*—Geoffrey Ida
(74) *Attorney, Agent, or Firm*—Townsend and Townsend and Crew LLP

(57) ABSTRACT

A semiconductor device 10 includes a first transistor 11 placed on a substrate 16, a second transistor 12 placed on the first transistor 11 via a heat radiation layer 17, a third transistor 13 placed on the substrate 16, and a fourth transistor 14 placed on the third transistor 11 via a heat radiation layer 17. The first transistor 11 has a first region corresponding to a region where the second transistor is placed, and a second region which is formed so as to surround the first region and in which the rate of area occupied by the emitter region in the base region is higher than in the first region. Likewise the first transistor 11, the third transistor 13 has a region in which the rate of area occupied by the emitter region in the base region is varied.

18 Claims, 8 Drawing Sheets

U.S. PATENT DOCUMENTS

| | | | |
|---|---|---|---|
| 4,639,762 A | 1/1987 | Neilson et al. | |
| 4,860,072 A | 8/1989 | Zommer | |
| 4,881,106 A | 11/1989 | Barron | |
| 4,959,699 A | 9/1990 | Lidow et al. | |
| 5,089,864 A | 2/1992 | Sakurai | |
| 5,187,555 A | 2/1993 | Kuroda et al. | |
| 5,229,629 A | 7/1993 | Koike | |
| 5,237,481 A | 8/1993 | Soo et al. | |
| 5,481,132 A * | 1/1996 | Moreau | 257/566 |
| 5,497,014 A | 3/1996 | Momose | |
| 5,557,127 A | 9/1996 | Ajit et al. | |
| 5,631,484 A | 5/1997 | Tsoi et al. | |
| 5,675,169 A * | 10/1997 | Hoshi et al. | 257/355 |
| 5,917,207 A | 6/1999 | Colwell et al. | |
| 5,973,376 A | 10/1999 | Rostoker et al. | |
| 6,002,153 A | 12/1999 | Tsunoda et al. | |
| 6,140,184 A | 10/2000 | Dupuy et al. | |
| 6,614,684 B1 | 9/2003 | Shukuri et al. | |
| 6,710,405 B2 | 3/2004 | Zommer et al. | |
| 6,747,300 B2 * | 6/2004 | Nadd et al. | 257/288 |
| 7,157,338 B2 | 1/2007 | Zommer et al. | |
| 2005/0046017 A1 * | 3/2005 | Dangelo | 257/720 |

FOREIGN PATENT DOCUMENTS

| | | |
|---|---|---|
| JP | 1-120359 | 8/1989 |
| JP | 9-129878 | 5/1997 |
| JP | 2000-164800 A | 6/2000 |
| JP | 2001-043985 A | 2/2001 |
| JP | 2002-076248 A | 3/2002 |
| JP | 2004-111656 | 4/2004 |

OTHER PUBLICATIONS

Office Action of Jun. 21, 2002 for U.S. Appl. No. 09/764,545, 5 pages.
Office Action of Oct. 2, 2002 for U.S. Appl. No. 09/764,545, 5 pages.
Office Action of Dec. 2, 2002 for U.S. Appl. No. 09/764,545, 10 pages.
Office Action of May 22, 2003 for U.S. Appl. No. 09/764,545, 18 pages.
Notice of Allowance of Oct. 8, 2003 for U.S. Appl. No. 09/764,545, 4 pages.
Office Communication of Dec. 8, 2003 for U.S. Appl. No. 09/764,545, 3 pages.
Office Action of Sep. 24, 2004, for U.S. Appl. No. 10/790,983, 8 pages.
Office Action of May 19, 2005, for U.S. Appl. No. 10/790,983, 8 pages.
Office Action of Oct. 11, 2005 for U.S. Appl. No. 10/790,983, 12 pages.
Office Action of May 4, 2006 for U.S. Appl. No. 10/790,983, 5 pages.
Advisory Action of Jun. 26, 2006 for U.S. Appl. No. 10/790,983, 4 pages.
Notice of Allowance and Fee(s) Due and Notice of Allowability of Aug. 11, 2006, for U.S. Appl. No. 10/790,983, 6 pages.

* cited by examiner

SEMICONDUCTOR DEVICE HAVING PLURAL REGIONS AND ELEMENTS WITH VARYING AREAS DEPENDING ON THE REGION

TECHNICAL FIELD

The present invention relates to a semiconductor device in which a plurality of semiconductor elements are mounted on a single support substrate.

BACKGROUND ART

In order to light a cold cathode fluorescent discharge tube used as a backlighting light source for liquid crystal, for example, an H-shaped bridge circuit 80 shown in FIG. 8 is used.

The H-shaped bridge circuit 80 comprises a first transistor 81 and third transistor 83 at a high side, and a second transistor 82 and fourth transistor 84 at a low side. A load 86 such as, for example, a cold cathode fluorescent discharge tube, etc. is connected between a connection node A1 between the emitter electrode of the first transistor 81 and the collector electrode of the second transistor 82, and a connection node A2 between the emitter of the third transistor 83 and the collector of the fourth transistor 84.

When a control circuit 85 switches on or off the first transistor 81 and fourth transistor 84, and the second transistor 82 and third transistor 83 alternately in the H-shaped bridge circuit 80, a current flows across the connection node A1 and the connection node A2 alternately, thereby enabling the load 86 to operate. In this manner, a direct-current voltage is converted into an alternating current in the H-shaped bridge circuit 80, making it possible to light, for example, a cold cathode fluorescent discharge tube.

In a case where such an H-shaped bridge circuit 80 is constructed on a single semiconductor device, four transistors and a control circuit for controlling them are mounted on a substrate. Therefore, the planar area of the semiconductor device becomes large, giving rise to a problem that the size of the semiconductor device becomes large.

Hence, such a method can be considered which reduces the planar area of the semiconductor device by stacking semiconductor elements, as disclosed in, for example, Unexamined Japanese Patent Application KOKAI Publication No. S55-111151.

DISCLOSURE OF INVENTION

Problem to be Solved by the Invention

However, the semiconductor device according to the stacking method disclosed in the above-indicated Unexamined Japanese Patent Application KOKAI Publication No. S55-111151 has a possibility of its elements being ruined, due to occurrence of a thermal runaway, because heat emitted from the semiconductor elements during operation is not radiated favorably. Particularly, semiconductor elements placed on lower levels easily gather heat, due to heat generated during operation and heat transmitted from the semiconductor elements stacked on upper levels, thus easily cause a thermal runaway.

Therefore, there is a demand for a semiconductor device which has a reduced planar area achieved by stacking its semiconductor elements, and also has a favorable heat radiation performance which would not allow heat concentration that might lead to a thermal runaway.

The present invention is made in view of the above-described circumstance, and an object of the present invention is to provide a semiconductor device which has a favorable heat radiation performance.

Means for Solving the Problem

To achieve the above object, a semiconductor device according to a first aspect of the present invention is a semiconductor device, comprising: a support substrate, a first semiconductor element placed on the support substrate; and a second semiconductor element placed on the first semiconductor element, wherein the first semiconductor element comprises a semiconductor base which comprises: a first semiconductor region of a first conductivity type; a second semiconductor region of a second conductivity type formed in a surface region of the first semiconductor region; and a third semiconductor region of the first conductivity type formed in a surface region of the second semiconductor region, and the semiconductor base of the first semiconductor element comprises: a first region in which the third semiconductor region occupies the second semiconductor region at a first rate and which is formed at a center part of the semiconductor base; and a second region in which the third semiconductor region occupies the second semiconductor region at a second rate higher than the first rate and which is formed at a circumferential part of the semiconductor base so as to surround the first region.

The first region may be formed so as to correspond to a region where the second semiconductor element is placed.

The first region may be formed to have generally a same area as the second semiconductor element.

The first semiconductor element and the second semiconductor element may be switched alternately.

A heat radiation layer may be formed between the first semiconductor element and the second semiconductor element.

There may be a plurality of the third semiconductor region, which may be formed so as to be spaced apart from each other.

The second semiconductor region may be formed in a belt shape.

There may be a plurality of the second semiconductor region, which may be formed side by side so as to be spaced apart from each other.

An impurity concentration of the second semiconductor region may be relatively high in the first region of the semiconductor base, and relatively low in the second region.

The semiconductor device may further comprise a first electrode formed on the second semiconductor region via an insulating film, and a film thickness of the insulating film may be relatively thick in the first region of the semiconductor base, and relatively thin in the second region.

The semiconductor base may further comprise a third region formed between the first region and the second region, and a rate at which the third semiconductor region in the third region occupies the second semiconductor region may be higher than the first rate and lower than the second rate.

The second semiconductor element may comprise a semiconductor base which comprises: a fourth semiconductor region of the first conductivity type; a fifth semiconductor region of the second conductivity type formed in a surface region of the fourth semiconductor region; and a sixth semiconductor region of the first conductivity type formed in a surface region of the fifth semiconductor region, and the semiconductor base of the second semiconductor element may comprise: a fourth region formed at a center part of the semiconductor base with a fourth rate of the sixth semiconductor region with respect to the fifth semiconductor region; and a fifth region in which the sixth semiconductor region occupies the fifth semiconductor region at a fifth rate higher than the fourth rate and which is formed in an annular shape at a circumferential part of the semiconductor base so as to surround the fourth region.

To achieve the above object, a semiconductor device according to a second aspect of the present invention is a semiconductor device, comprising: a support substrate; a first semiconductor element placed on the support substrate; a second semiconductor element placed on the first semiconductor element; a third semiconductor element formed on the support substrate; and a fourth semiconductor element placed on the third semiconductor element, wherein the first semiconductor element and the third semiconductor element each comprise a semiconductor base which comprises: a first semiconductor region of a first conductivity type; a second semiconductor region of a second conductivity type formed in a surface region of the first semiconductor region; and a third semiconductor region of the first conductivity type formed in a surface region of the second semiconductor region, and each the semiconductor base comprises: a first region formed at a center part of the semiconductor base with a first rate of the third semiconductor region with respect to the second semiconductor region; and a second region in which the third semiconductor region occupies the second semiconductor region at a second rate higher than the first rate and which is formed at a circumferential part of the semiconductor base so as to surround the first region.

The first region of the first semiconductor element may be formed in a region where the second semiconductor element is placed, and the first region of the third semiconductor element may be formed in a region where the fourth semiconductor element is placed.

A heat radiation layer may be formed between the first semiconductor element and the second semiconductor element, and between the third semiconductor element and the fourth semiconductor element.

A semiconductor element for a controlling purpose may further be formed on the support substrate, and the first semiconductor element and the fourth semiconductor element, and the second semiconductor element and the third semiconductor element may be switched alternately by the semiconductor element for the controlling purpose.

To achieve the above object, a semiconductor device according to a third aspect of the present invention is a semiconductor device, comprising: a first semiconductor element placed on a support substrate; and a second semiconductor element placed on the first semiconductor element and having a semiconductor region which faces a semiconductor region of the first semiconductor element, wherein at least one of the first semiconductor element and the second semiconductor element comprises in the semiconductor region: a first semiconductor region of a first conductivity type; a second semiconductor region of a second conductivity type formed in a surface region of the first semiconductor region; and a third semiconductor region of the first conductivity type formed in a surface region of the second semiconductor region, and the at least one semiconductor element comprises: a first region in which the third semiconductor region occupies the second semiconductor region at a first rate and which is formed at a center part of the semiconductor region; and a second region in which the third semiconductor region occupies the second semiconductor region at a second rate higher than the first rate and which is formed at a circumferential part of the semiconductor region so as to surround the first region.

To achieve the above object, a semiconductor device according to a fourth aspect of the present invention is a semiconductor device, comprising a plurality of semiconductor elements sequentially stacked on a support substrate, wherein of the plurality of semiconductor elements, each such a semiconductor element as having a semiconductor region which at least partially faces an adjoining semiconductor element comprises in the semiconductor region; a first semiconductor region of a first conductivity type; a second semiconductor region of a second conductivity type formed in a surface region of the first semiconductor region; and a third semiconductor region of the first conductivity type formed in a surface region of the second semiconductor region, and a first region in which the third semiconductor region occupies the second semiconductor region at a first rate is formed at a center part of the semiconductor region, and a second region in which the third semiconductor region occupies the second semiconductor region at a second rate higher than the first rate is formed at a circumferential part of the semiconductor region so as to surround the first region.

Figure 1:
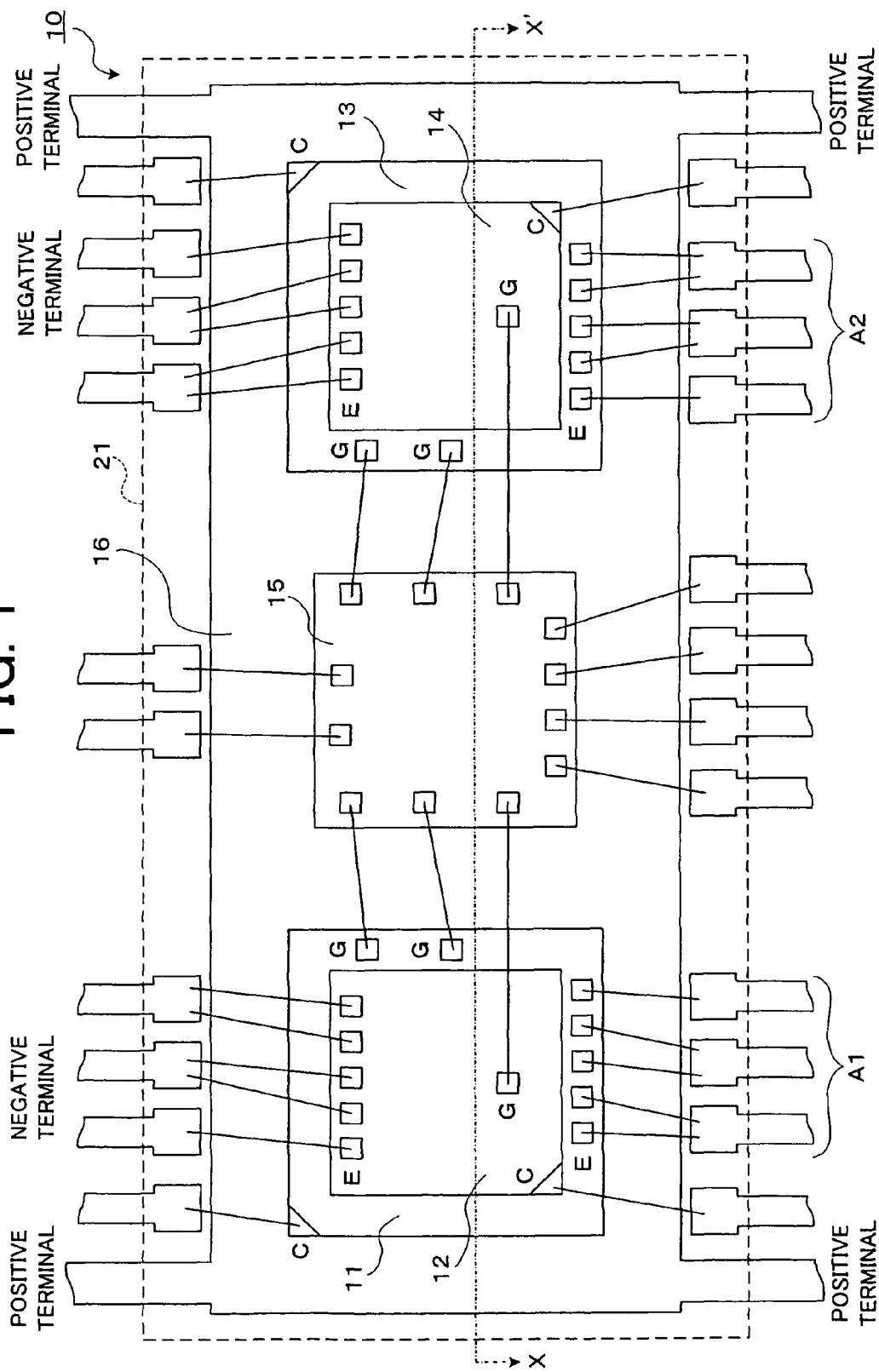
[FIG. 1] It is a plan view showing an example of the structure of a semiconductor device according to an embodiment of the present invention.

EXPLANATION OF REFERENCE NUMERALS 10 semiconductor device
11 first transistor
12 second transistor
13 third transistor
14 fourth transistor
15 control circuit
16 substrate
17 heat radiation layer
18 solder layer
30 N type base region
31 P type collector region
32 P type base region
33 N type emitter region
34 N type buffer region
35 emitter electrode
36 collector electrode
37 gate electrode 38 gate insulating film
39 interlayer insulating film

BEST MODE FOR CARRYING OUT THE
INVENTION

A semiconductor device according to an embodiment of the present invention will be explained using the drawings.

In the present embodiment, explanation will be given by employing, as an example, a case where insulated gate bipolar transistors (hereinafter, IGBT) are used as semiconductor elements to constitute a semiconductor device.

Figure 2:
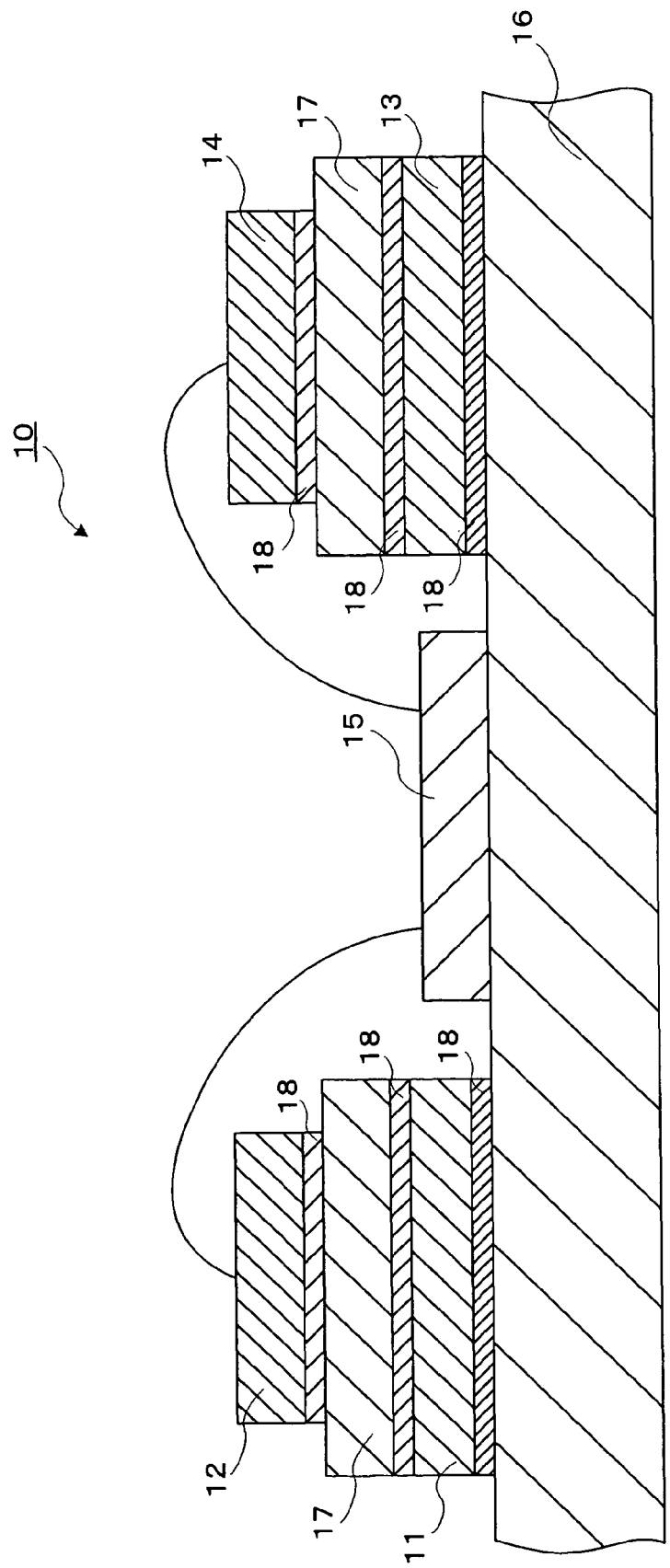
[FIG. 2] It is a cross sectional view of the semiconductor device shown in FIG. 1 as taken along a line X-X'.
Figure 8:
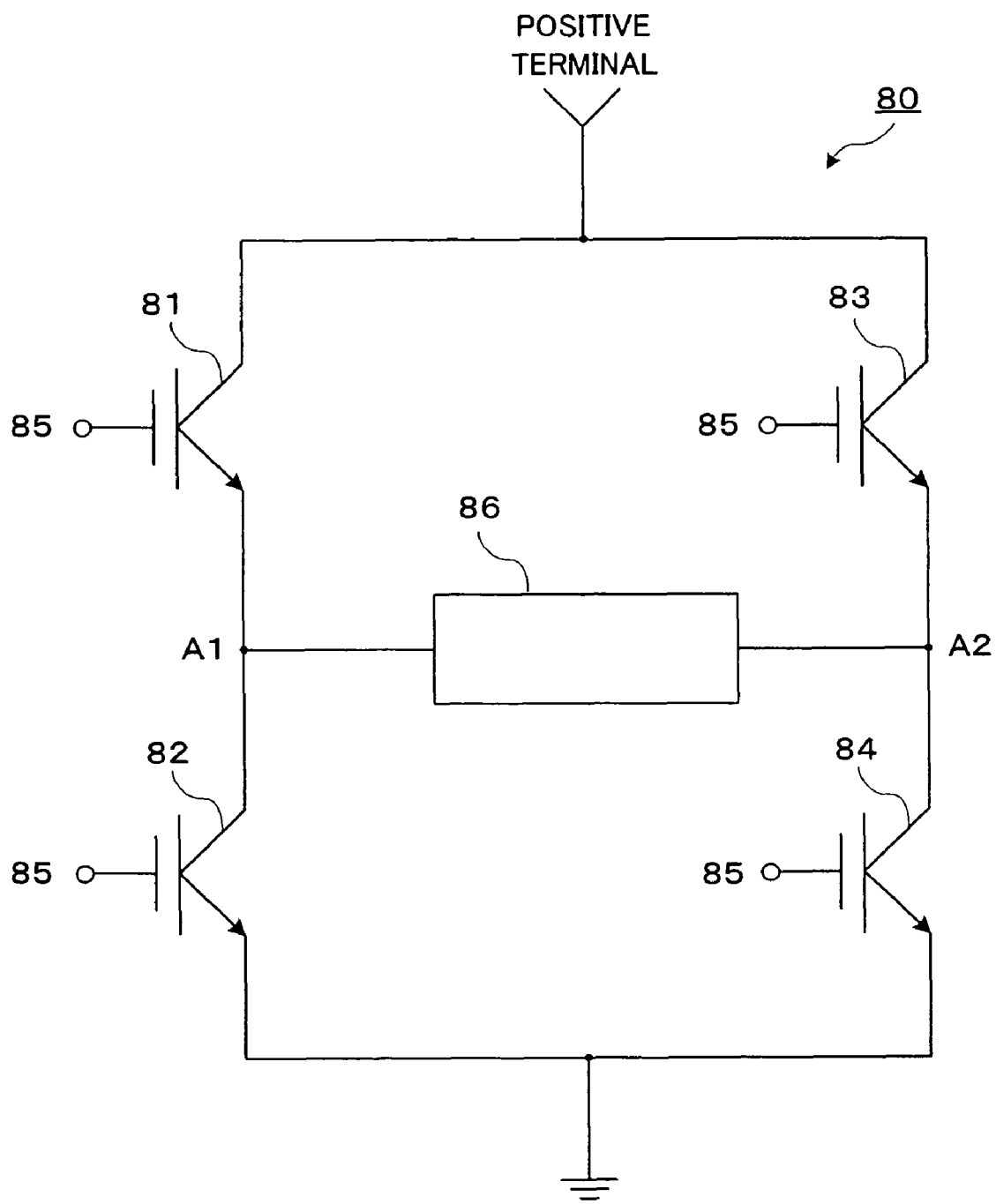
[FIG. 8] It is a diagram showing an H-shaped bridge circuit.

A semiconductor device 10 according to an embodiment of the present invention is shown in FIG. 1 and FIG. 2. FIG. 1 is a plan view showing the semiconductor device 10. FIG. 2 is a cross sectional view of the semiconductor device 10 shown in FIG. 1 as taken along a line X-X'. The semiconductor device 10 according to the present invention constitutes the H-shaped bridge circuit 80 shown in FIG. 8

The semiconductor device 10 comprises a first transistor 11, a second transistor 12, a third transistor 13, a fourth transistor 14, a substrate 16, a control circuit 15, heat radiation layers 17, and solder layers 18, and is sealed by a resin sealing body 21, as shown in FIG. 1 and FIG. 2. The first transistor 11, the second transistor 12, the third transistor 13, and the fourth transistor 14 each comprise an IGBT, and perform switching operations by the control circuit 15.

The first transistor 11 is placed on the substrate 16 via the solder layer 18 as shown in FIG. 2. As will be described later, the emitter regions of the first transistor 11 comprise a first region formed at the center part of the first transistor 11, and a second region formed at the peripheral part of the first transistor 11 so as to surround the first region. The first region of the emitter regions has generally the same area as that of the second transistor 12, and is formed so as to correspond to the position at which the second transistor 12 is placed. The first region and second region of the emitter regions have different rates of area occupied in the base regions. The rate of area occupied in the base regions in the first region is smaller, as compared with the second region.

The second transistor 12 is placed, via the solder layer 18, on the heat radiation layer 17, which is placed on the first transistor 11 via the solder layer 18. The first transistor 11 and the second transistor 12 are electrically connected via the heat radiation layer 17. Unlike the first transistor 11, the second transistor 12 is formed to have a uniform area distribution for its emitter regions.

The third transistor 13 is disposed on the substrate 16 via the solder layer 18, as shown in FIG. 2. Likewise in the first transistor 11, the emitter regions of the third transistor 13 comprise a first region formed at the center part of the third transistor 13 and a second region formed at the peripheral part of the first transistor 13 so as to surround the first region. The first region has generally the same area as that of the fourth transistor 14, and is formed so as to correspond to the position at which the second transistor 12 is placed. The first region and second region of the emitter regions have different rates of area occupied in the base regions. The rate of area occupied in the base regions in the first region is smaller, as compared with the second region.

The fourth transistor 14 is placed, via the solder layer 18, on the heat radiation layer 17, which is placed on the third transistor 13 via the solder layer 18, as shown in FIG. 2. The third transistor 13 and the fourth transistor 14 are electrically connected via the heat radiation layer 17. Likewise the second transistor 12, the fourth transistor 14 is also formed to have a uniform area distribution for its emitter regions.

The control circuit 15 is connected to the gate electrode of each of the first transistor 11 to the fourth transistor 14, as shown in FIG. 1. Each transistor is switched to be on or off by the control circuit 15, such that the second transistor 12 and the third transistor 13 are off when the first transistor 11 and the fourth transistor 14 are on, and the second transistor 12 and the third transistor 13 are on when the first transistor 11 and the fourth transistor 14 are off. By each transistor being switched on or off by the control circuit 15 in this manner, an alternating current flows through the load 86 of the H-shaped bridge circuit 80 shown in FIG. 8.

The substrate 16 is formed of a metal plate of copper, aluminum, or the like. Heat emitted from the first transistor 11 and third transistor 13 is radiated via the substrate 16.

The heat radiation layers 17 are formed of a metal plate of copper, aluminum, or the like, and formed between the first transistor 11 and the second transistor, and between the third transistor 13 and the fourth transistor 14. Heat emitted from the respective transistors is transmitted to the heat radiation layers 17 via the solder layers 18 and radiated therefrom. The heat radiation layers 17 may be formed not only of a metal plate, but of a thin solder layer.

Hereinafter, the first transistor 11 will specifically be explained by using FIG. 3 to FIG. 6. Since the third transistor 13 has the same configuration as that of the first transistor 11 except that the first region of the emitter region thereof is formed to correspond to the region where the fourth transistor 14 is placed, explanation will be given by employing only the first transistor 11 as an example.

Figure 3:
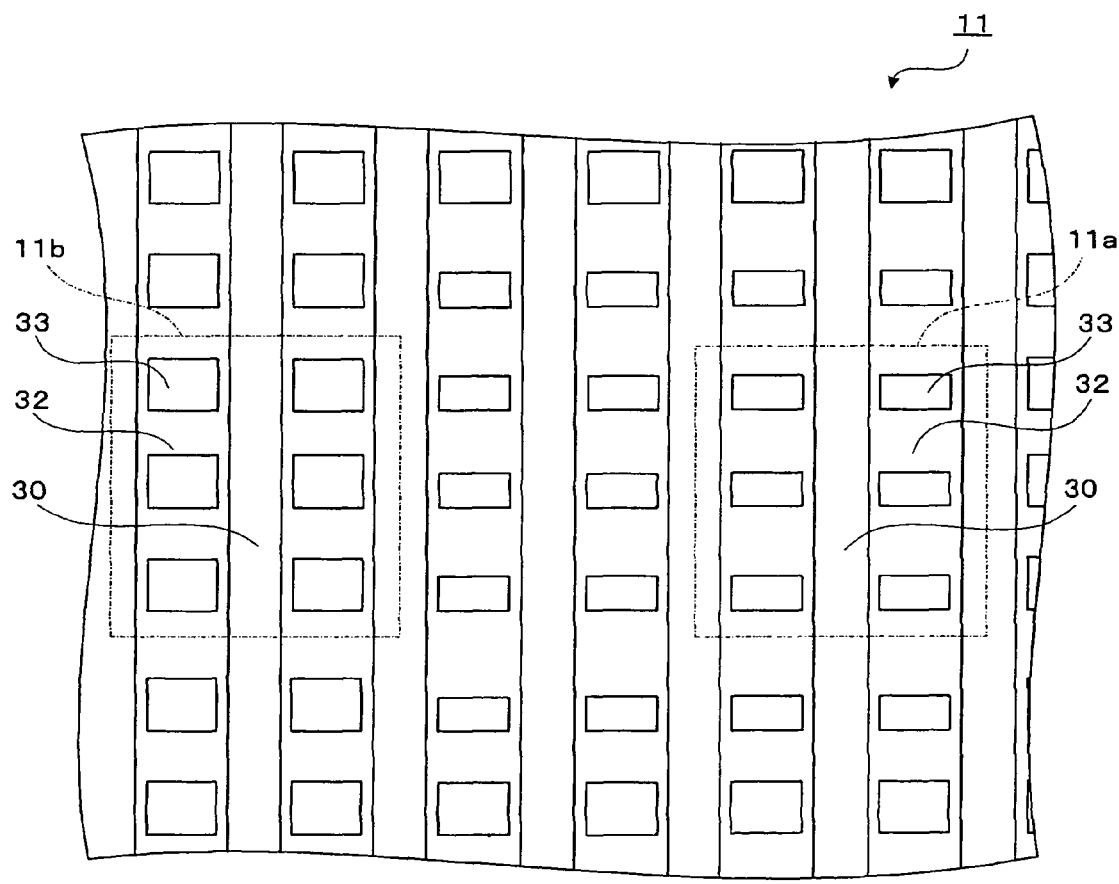
[FIG. 3] It is a plan view showing an example of the structure of a first transistor according to an embodiment of the present invention.
Figure 4:
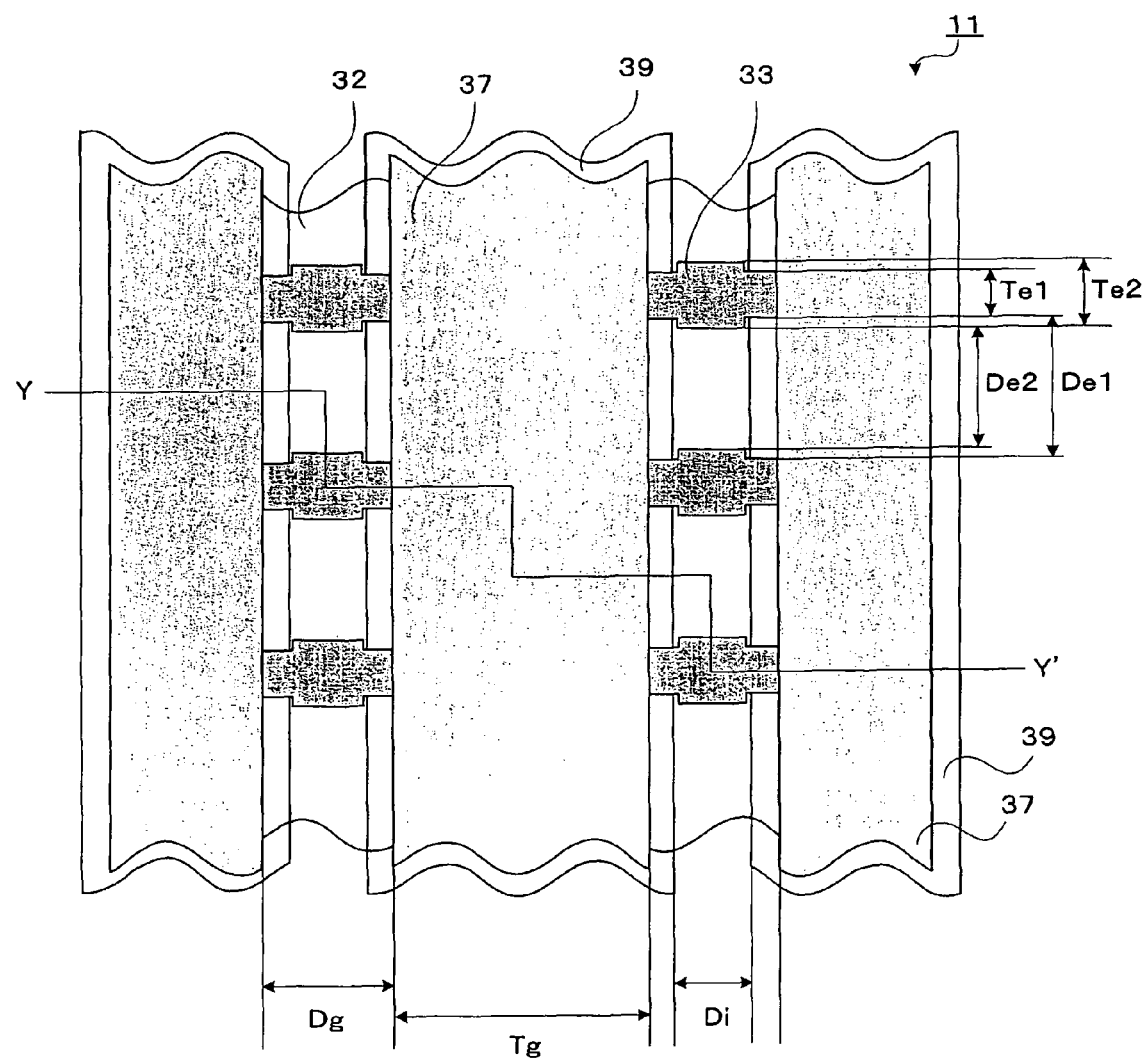
[FIG. 4] It is a plan view showing an example of the structure of a region at the center part of the first transistor shown in FIG. 3.
Figure 5:
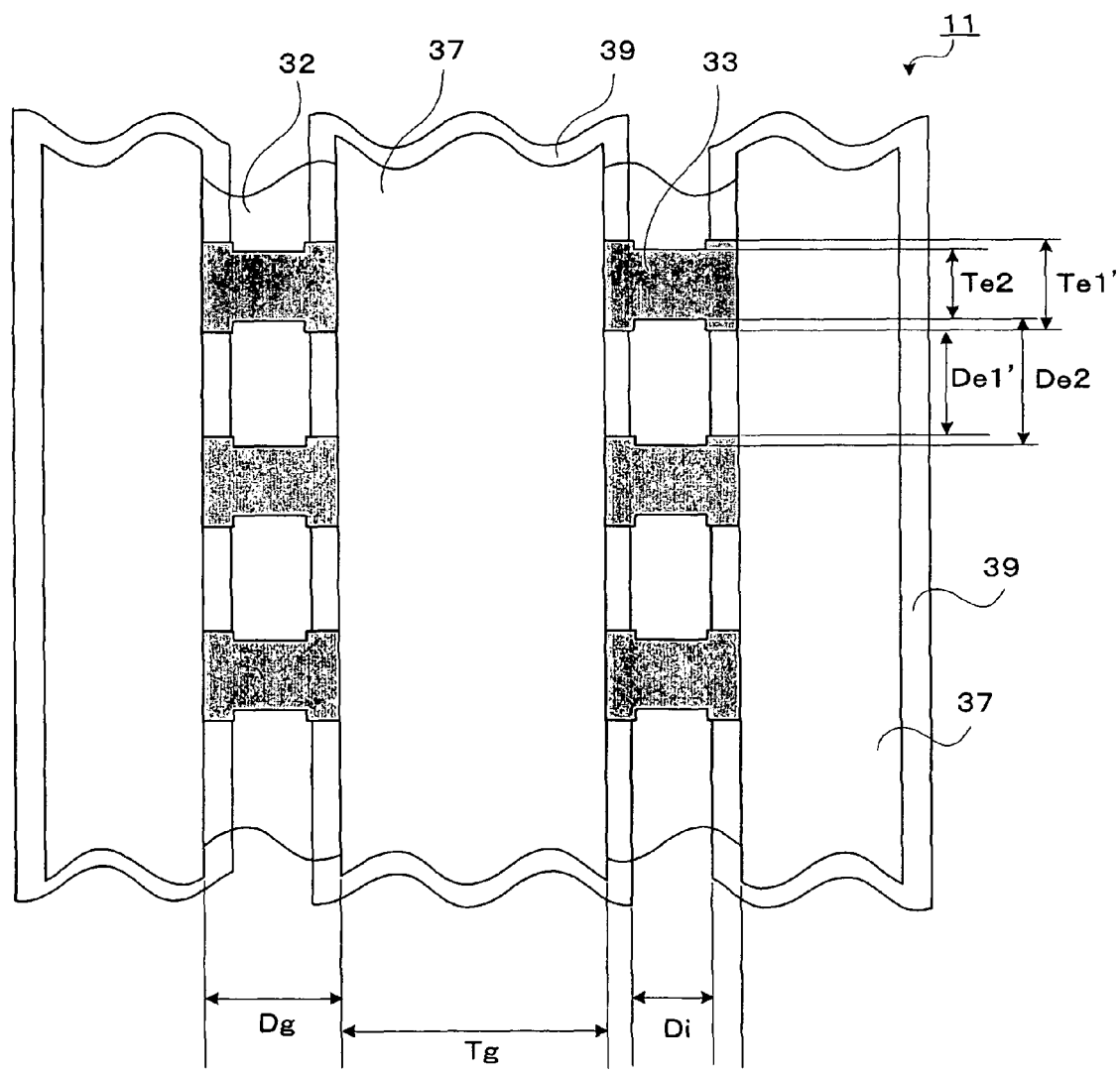
[FIG. 5] It is a plan view showing an example of the structure of a region at the peripheral part of the first transistor shown in FIG. 3.
Figure 6:
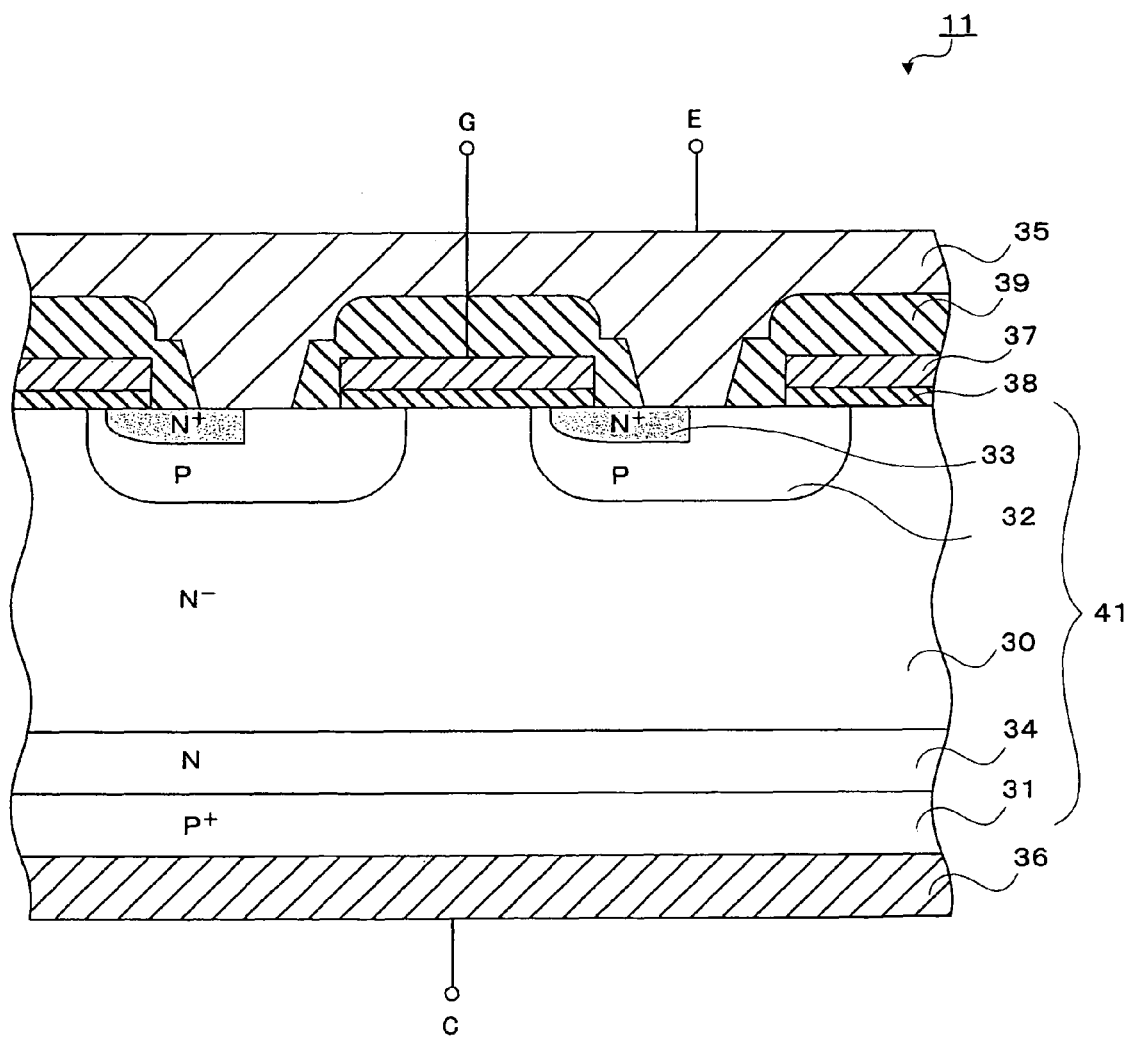
[FIG. 6] It is a cross sectional view of the first transistor shown in FIG. 4 as taken along a line Y-Y'.

FIG. 3 is a plan view showing an example of the structure of the first transistor 11. FIG. 4 is a plan view showing a region 11a enclosed by a dashed line in the first transistor 11 shown in FIG. 3. FIG. 5 is a plan view showing a region 11b enclosed by a dashed line in the first transistor 11 shown in FIG. 3. FIG. 6 is a cross sectional view of the first transistor 11 shown in FIG. 4 as taken along Y-Y'. In FIG. 3, in order to make the explanation of the disposition of N type emitter regions 33 easier, an emitter electrode 35, gate electrodes 37, and interlayer insulating films 39, which are to be described later, are omitted, and the shapes of the N type emitter regions 33 are illustrated as rectangles unlike in FIG. 4 and FIG. 5. In FIG. 4 and FIG. 5, the emitter electrode 35 to be described later is omitted.

As shown in FIG. 6, the first transistor 11 comprises a semiconductor base 41, an emitter electrode 35, a collector electrode 36, gate electrodes 37, gate insulating films 38, and interlayer insulating films 39. The semiconductor base 41 comprises an N type base region 30, a P type collector region 31, P type base regions 32, N type emitter regions 33, and an N type buffer region 34.

The N type base region 30 is formed of an N type semiconductor region in which an N type (first conductivity type) impurity such as, for example, phosphorus or the like is diffused. The N type base region 30 is formed to have a thickness of, for example, about 45 μm and an impurity concentration of about $2\times10^{14}$ cm$^{-3}$.

The P type collector region 31 is formed of a P type semiconductor region in which a P type (second conductivity type) impurity such as, for example, boron or the like is diffused, and is formed on the lower surface of the N type buffer region 34 as shown in FIG. 6. The collector electrode 36 is formed on the lower surface of the P type collector region 31. While the first transistor 11 is operating, the P type collector region 31 injects holes (positive holes) into the N type base region 30 and brings about conductivity modulation. The P type collector region 31 is formed to have a thickness of, for example, about 200 μm. The P type impurity concentration of the P type collector region 31 is higher than the impurity concentration of the P type base regions 32, and formed to be an impurity concentration of, for example, about $4 \times 10^{18}$ cm$^{-3}$.

The P type base regions 32 are formed of a P type semiconductor region in which a P type impurity is diffused, and are formed in the surface regions of the N type base region 30 as shown in FIG. 6. The P type base regions 32 are formed in a belt shape as shown in FIG. 6, and formed side by side so as to be spaced apart from each other. The gate electrodes 37 are formed, via the gate insulating films 38, on the P type base regions 32, which are between the N type base region 30 and the N type emitter regions 33. When a voltage equal to or greater than a threshold voltage is applied to the gate electrodes 37, channels are formed in the P type base regions 32. The P type base regions 32 are formed to have a thickness of, for example, about 3 µm. The P type impurity concentration of the P type base regions 32 is lower than the impurity concentration of the P type collector region 31, and formed to be an impurity concentration of, for example, about $2 \times 10^{17}$ cm$^{-3}$.

The N type emitter regions 33 are formed of an N type semiconductor region in which an N type impurity is diffused, and are formed in the surface regions of the P type base regions 32. The emitter electrode 35 is formed on the upper surface of the N type emitter regions 33 as shown in FIG. 6. The N type emitter regions 33 are formed to have a thickness of, for example, about 0.5 µm. The N type impurity concentration of the N type emitter regions 33 is higher than the N type base region 30, and formed to be an impurity concentration of, for example, about $5 \times 10^{19}$ cm$^{-3}$.

Further, as shown in FIG. 3, the N type emitter regions 33 comprises a first region which is formed at the center part of the first transistor 11 and in which the N type emitter regions 33 have a low rate of occupation in the P type base regions 32, and a second region which is formed so as to surround the first region and in which the N type emitter regions 33 have a higher rate of occupation in the P type base regions 32 as compared with the first region. The first region of the N type emitter regions 33 is formed so as to correspond to the region at which the second transistor 12 is placed.

Specifically, the center part of the first transistor 11, at which the first region of the N type emitter regions 33 is formed, is constructed such that a width Te1 of the N type emitter regions 33 under the gate electrodes 37 and interlayer insulating films 39 is 3 µm, a width Te2 of the N type emitter regions 33 under the emitter electrode 35 is 4.5 µm, an interval De1 between adjoining N type emitter regions 33 under the interlayer insulating film 39 is 12 µm, and an interval De2 between adjoining N type emitter regions 33 under the emitter electrode 35 is 10.5 µm, as shown in FIG. 4.

On the other hand, the peripheral part of the first transistor 11, at which the second region of the N type emitter regions 33 is formed, is constructed such that a width Te1' of the N type emitter regions 33 under the interlayer insulating films 39 is 6 µm, a width Te2' of the N type emitter regions 33 under the emitter electrode 35 is 4.5 µm, an interval De1' between adjoining N type emitter regions 33 under the interlayer insulating film 39 is 9 µm, and an interval De2 between adjoining N type emitter regions 33 under the emitter electrode 35 is 10.5 µm.

Here, in order to explain the difference between the area rates of the N type emitter regions 33, an emitter thinning ratio calculated by dividing the distance between adjoining N type emitter regions 33 by the sum of the width of the N type emitter regions 33 and the distance between the adjoining N type emitter regions 33 is used for expediency. In the present embodiment, since the width of the N type emitter regions 33 under the emitter electrode 35 is formed to be uniform, the width of the N type emitter regions 33 and distance between adjoining N type emitter regions 33, which are under the interlayer insulating films 39, are used.

Specifically, since the width Te1 of the N type emitter regions 33 is 3 µm and the width De1 for spacing the N type emitter regions 33 is 12 µm in the center part shown in FIG. 4 of the first transistor 11, the emitter thinning ratio is 80%. On the other hand, since the width Te1' of the N type emitter regions 33 is 6 µm and the width De1' for spacing the N type emitter regions 33 is 9 µm in the peripheral part shown in FIG. 5 of the first transistor 11, the emitter thinning ratio is 60%. Accordingly, the first transistor 11 of the present embodiment, when expressed by using emitter thinning ratio, is formed to have an emitter thinning ratio of 80% in the center part and an emitter thinning ratio of 60% in the peripheral part.

The N type buffer region 34 is formed of an N type semiconductor region in which an N type impurity is diffused, and is formed on the upper surface of the P type collector region 31. The N type buffer region 34 suppresses positive hole injection into the N type base region 30.

The emitter region 35 is formed of aluminum or the like, and formed on the upper surface of the N type emitter regions 33, etc. The emitter region 35 and the gate electrodes 37 are insulated by the interlayer insulating films 39 of a silicon-base film or the like. As shown in FIG. 4 and FIG. 5, the interval between adjoining interlayer insulating films 39 is 5 µm.

The collector electrode 36 is formed of aluminum or the like, and formed on the lower surface of the P type collector region 31 as shown in FIG. 6.

The gate electrodes 37 are formed of polysilicon or the like, and disposed, via the gate insulating films 38 of a silicon-base film or the like, on the P type base regions 32 between the N type base region 30 and the N type emitter regions 33, as shown in FIG. 6. A width Tg of the gate electrodes 37 shown in FIG. 4 and FIG. 5 is 26 µm. A width Dg between adjoining gate electrodes 37 is 8 µm.

When a voltage is applied to the gate electrodes 37 of the first transistor 11 of the semiconductor device 10 having the above-described structure, an electric field is generated and depletion layers are formed in the surface regions of the P type base regions 32 under the gate insulating films 38. When the voltage applied becomes equal to or greater than a threshold voltage, inversion layers (channels) are formed in the surface regions of the P type base regions 32. As a result, electrons are injected into the N type base region 30 from the N type emitter regions 33 through the channels, and positive holes are injected into the N type base region 30 from the P type collector region 31. Then, currents flow across the N type emitter region 33 and the P type collector region 31 through the channels and N type base region 30, thereby to switch on the first transistor 11.

The first transistor 11 according to the present embodiment is formed such that the rate of area occupied by the N type emitter regions 33 in the P type base regions 32 in the center part of the first transistor 11 is smaller than the rate of area occupied by the N type emitter regions 33 in the base regions 32 in the peripheral part. Accordingly, when the first transistor 11 is being on, the currents that flow through the center part of the first transistor 11 are smaller as compared with the peripheral part, and heat generated in the center part is smaller as compared with the peripheral part. As a result, a thermal runaway becomes less likely to occur in the center part of the first transistor 11 even in a case where heat generated in the peripheral part is transmitted and adds up to the heat generated in the center part. Further, even in a case where heat generated emitted from the second transistor 12 stacked at the upper level is transmitted to the first transistor 11 via the heat radiation layer, since the emitter regions of the first transistor 11 are formed correspondingly to the position where the second transistor 12 is stacked, occurrence of a thermal runaway due to heat concentration can be prevented.

Figure 7C:
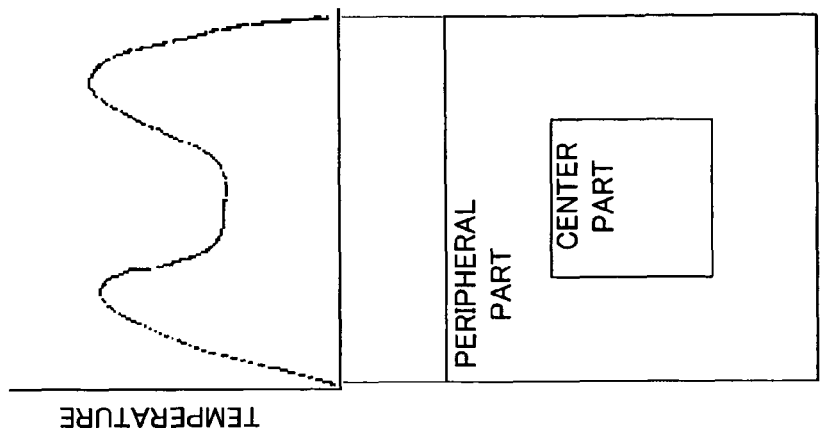
[FIGS. 7A to 7C] They are diagrams showing distribution of the temperature of a semiconductor base in a case where emitter thinning ratio is varied.
Figure 7B:
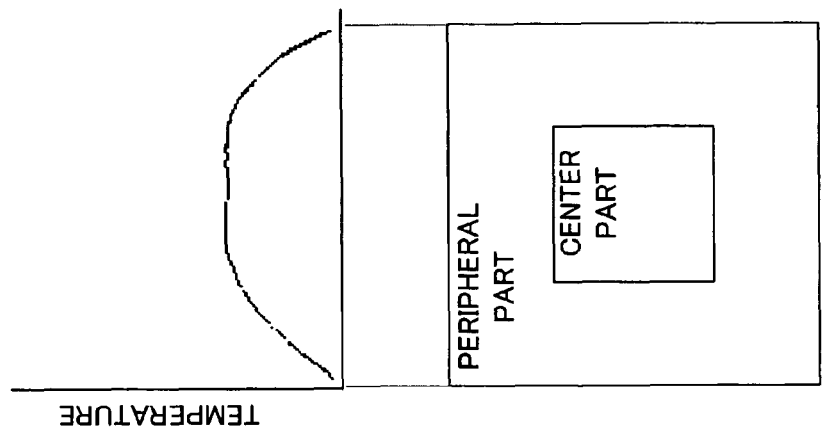
Figure 7A:
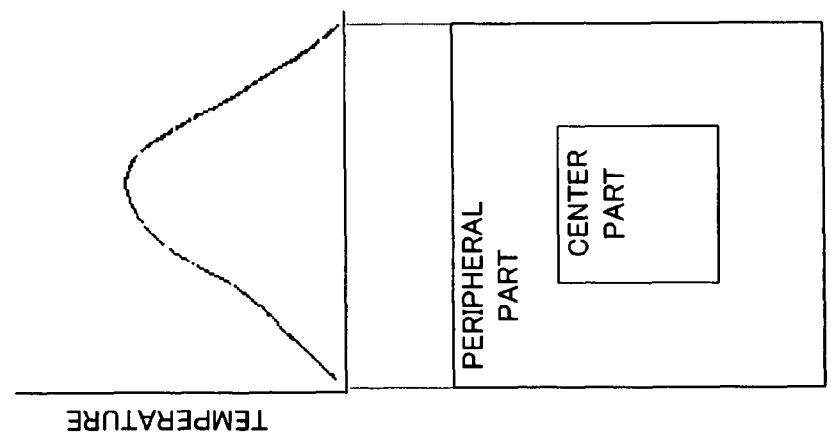

The distribution of the temperature of the semiconductor base of the semiconductor element is shown in FIGS. 7A to 7C, where, for example, the emitter thinning ratio at the peripheral part of the semiconductor element is 60%, and the emitter thinning ratio at the center part is varied among 60%, 80% and 100%.

In case of the emitter thinning ratio being 60% (uniform emitter thinning ratio), since heat generated from the peripheral part adds up to heat generated at the center part of the semiconductor element, a favorable heat radiation is not available at the center part of the semiconductor element and the temperature increases from the periphery of the semiconductor element to the center thereof, as shown in FIG. 7A. In this case, a thermal runaway is likely to occur at the center part of the semiconductor element.

On the other hand, in case of the emitter thinning ratio being 100%, since there is no heat generated at the center part of the semiconductor element, no heat is concentrated at the center part of the semiconductor element and the temperature gets high only at the peripheral part of the semiconductor element, as shown in FIG. 7C. However, in case of the emitter thinning ratio being 100%, the semiconductor element needs to be formed such that the emitter regions in the peripheral part have a larger rate of area as compared with a case of the emitter thinning ratio being 60% in order to secure the same current capacity as that of the case of the emitter thinning ratio being 60% or 80%. Therefore, heat generation particularly at the peripheral part becomes high.

As compared, in case of the emitter thinning ratio being 80%, the temperature increases from the peripheral part of the semiconductor element to the center thereof as shown in FIG. 7B. However, since heat generated at the center part of the semiconductor element is small, the center part will not get it remarkably high even if heat is transmitted thereto from the peripheral part. Accordingly, the center part of the first transistor 11, which adopts the same structure as the semiconductor element of FIG. 7B, will not bring about heat concentration, making it possible to suppress a thermal runaway in the first transistor 11.

Further, the first region of the N type emitter regions 33 of the first transistor 11 is formed so as to correspond to the region where the second transistor 12 is placed. Accordingly, even in a case where there is not only the heat emitted from the first transistor 11 itself but also heat transmitted from the second transistor 12 via the heat radiation layer 17, heat concentration can be suppressed and a thermal runaway can be prevented.

Further, since the semiconductor element according to the present embodiment has the rate of area occupied by the N type emitter regions 33 in the P type base regions 32 reduced only in the center part where heat particularly gets concentrated, it can secure the current amount of the peripheral part where heat does not concentrate, making is possible to suppress reduction in the current capacity of the first transistor 11 on the whole.

Further, the semiconductor device 10 according to the present invention alternately operates, by means of the control circuit 15, such that the second transistor 12 and the third transistor 13 are off when the first transistor 11 and the fourth transistor 14 are on. As a result, the operation timings of the respective transistors stacked are staggered and the timings of heat generation are staggered, making it possible to prevent heat concentration on the first transistor 11 and third transistor 13 placed on the lower level.

Further, with the heat radiation layers 17 formed between the stacked transistors, the semiconductor device 10 according to the present invention can further favorably radiate heat emitted from the respective transistors placed above and under the heat radiation layers 17.

According to the present invention, since the first transistor 11 and the second transistor 12, and the third transistor 13 and the fourth transistor 14 are electrically connected via the heat radiation layers 17, there is no need of doing wire bonding or the like at another occasion, and the structure of the semiconductor device 10 is not complicated.

Varying the rate of the base regions occupied by the emitter regions between he center part and circumferential part of the element as in the present invention not only enhances the heat radiation performance of the first transistor 11 and third transistor 13, but also provides an effective means as a method for improving the resistance of F-ASO, etc. having an intimate relation with heat generation and heat radiation.

The present invention is not limited to the above-described embodiment, but can be modified and applied in various manners.

For example, in the above-described embodiment, the explanation has been given by employing, as an example, a structure in which the second transistor 12 and fourth transistor 14 have their emitter regions formed uniformly unlike the first transistor 11. However, this is not the only case, but the N type emitter regions of the second transistor 12 and fourth transistor 14 may also be varied as needed, likewise in the first transistor 11.

Further, in the above-described embodiment, the explanation has been given by employing, as an example, a structure in which the emitter thinning ratio of the first region of the emitter regions of the first transistor 11 is 80% and the emitter thinning ratio of the second region is 60%. However, this is not the only case, but the thinning ratio may be varied in accordance with the performance required of the first transistor 11 completed, the operation environment, etc. For example, the emitter thinning ratio of the first region may be set to 70% to 90%, and that of the second region may be set to 40% to 60%.

Further, the emitter regions are not limited to the case of being built up of the first region and the second region, but may be structured to further comprise a third region formed between the first region and the second region. In this case, the emitter thinning ratio is reduced in the order of the first region, the third region, and the second region.

In the above-described embodiment, a method based on a cell thinning ratio is employed in order to set the degree of the element's behavior in the cell unit, but this is not the only case. For example, it is also possible to employ a scheme of raising the threshold voltage at the center part of the first transistor 11, in order to suppress heat generation at the center part of the first transistor 11, i.e., to reduce the current amount. For example, it is possible to employ a scheme of thickening the gate insulating films 38 at the center part of the first transistor 11, or a scheme of raising the impurity concentration of the P type base regions 32 at the center part of the first transistor 11. In this case, the thickness of the gate insulating films 38 or the concentration in the P type base regions 32 is adjusted from the performance required of the first transistor 11, the operation environment, etc. It is also possible to arbitrarily combine the scheme of increasing the emitter thinning ratio of the first transistor 11, the scheme of thickening the thickness of the gate insulating films 38 at the center part of the first transistor 11, and the scheme of raising the impurity concentration of the P type base regions 32 at the center part.

In the above-described embodiment, the first transistor 11 on the substrate 16, above which the second transistor 12 is placed, is formed to make the rate of area occupied by the N type emitter regions 33 in the P type base regions 32 in the center part smaller than the rate of area occupied by the N type emitter regions 33 in the P type base regions 32 in the peripheral region. Further, the thickness of the gate insulating films 38 or the impurity concentration of the P type base regions 32 are varied between the center part and the peripheral part, so that the threshold voltage at the center part of the first transistor 11 may be raised.

However, in a case where two transistors are disposed on a substrate so as to face each other or in a case where a reverse-staggered transistor and a top-gate transistor are sequentially disposed, it is also effective in preventing a thermal runaway caused due to heat concentration on the stacked portion, to vary the rate of area occupied by the N type emitter regions in the P type base regions, the thickness of the gate insulating films, or, the impurity concentration of the P type base regions between the center part and the peripheral part in the above-described manner, not in the first transistor but in the second transistor placed thereabove.

In the above-described embodiment, the semiconductor device 10 comprising the first transistor 11 and the second transistor 12, which are stacked on the substrate 16, has been explained. However, the present invention can be applied to a semiconductor device comprising semiconductor elements stacked in multiple layers of three or more, not only two layers. In this case, any semiconductor element that has any semiconductor region that faces an adjoining semiconductor element may be structured such that the N type emitter regions occupy the P type base regions at a first rate at the center part and the N type emitter regions occupy the P type base regions at a second rate higher than the first rate at the peripheral part which surrounds the center part. At this time, it is preferred that the first region match the area of the stacked portion of the adjoining semiconductor element. Further, the thickness of the gate insulating films or the impurity concentration of the P type base regions may be varied between the center part and the peripheral part as described above.

The present application claims priority to Japanese Patent Application No. 2005-44676 filed on Feb. 21, 2005, the contents of the specification, claims, summary, and drawings of which are incorporated herein by reference.

INDUSTRIAL APPLICABILITY

The present invention can be applied to a semiconductor element in which unit cells are repeatedly disposed, such as an IGBT, a MOSFET (Metal Oxide Semiconductor Field Effect Transistor), etc. Further, the present invention can also be applied to a reverse-conductivity type semiconductor element.

The invention claimed is:

1. A semiconductor device, comprising: a support substrate, a first semiconductor element placed on said support substrate; and a second semiconductor element placed on said first semiconductor element,
   wherein said first semiconductor element comprises a semiconductor base which comprises: a first semiconductor region of a first conductivity type; a second semiconductor region of a second conductivity type formed in a surface region of said first semiconductor region and having a surface area; and a third semiconductor region of the first conductivity type formed in a surface region of said second semiconductor region, said third semiconductor region having a surface area, and
   said semiconductor base of said first semiconductor element comprises: a first region in which said third semiconductor region occupies said second semiconductor region at a first ratio and which is formed at a center part of said semiconductor base; and a second region in which said third semiconductor region occupies said second semiconductor region at a second ratio higher than the first ratio and which is formed at a circumferential part of said semiconductor base so as to surround said first region,
   wherein said first ratio and said second ratio, each, is a ratio of said surface area of said third semiconductor region relative to said surface area of said second semiconductor region.

2. The semiconductor device according to claim 1, wherein said first region is formed so as to correspond to a region where said second semiconductor element is placed.

3. The semiconductor device according to claim 1, wherein said first region is formed to have generally a same area as said second semiconductor element.

4. The semiconductor device according to claim 1, wherein said first semiconductor element and said second semiconductor element are switched alternately.

5. The semiconductor device according to claim 1, wherein a heat radiation layer is formed between said first semiconductor element and said second semiconductor element.

6. The semiconductor device according to claim 1, wherein there are a plurality of said third semiconductor region, which are formed so as to be spaced apart from each other.

7. The semiconductor device according to claim 1, wherein said second semiconductor region is formed in a belt shape.

8. The semiconductor device according to claim 1, wherein there are a plurality of said second semiconductor region, which are formed side by side so as to be spaced apart from each other.

9. The semiconductor device according to claim 1, wherein an impurity concentration of said second semiconductor region is relatively high in said first region of said semiconductor base, and relatively low in said second region.

10. The semiconductor device according to claim 1, wherein said semiconductor device further comprises a first electrode formed on said second semiconductor region via an insulating film, and a film thickness of said insulating film is relatively thick in said first region of said semiconductor base, and relatively thin in said second region.

11. The semiconductor device according to claim 1, wherein said semiconductor base further comprises a third region formed between said first region and said second region, and a ratio at which said third semiconductor region in said third region occupies said second semiconductor region is higher than the first ratio and lower than the second ratio.

12. The semiconductor device according to claim 1, wherein said second semiconductor element comprises a semiconductor base which comprises: a fourth semiconductor region of the first conductivity type; a fifth semiconductor region of the second conductivity type formed in a surface region of said fourth semiconductor region; and a sixth semiconductor region of the first conductivity type formed in a surface region of said fifth semiconductor region, and said semiconductor base of said second semiconductor element comprises: a fourth region formed at a center part of said semiconductor base with a fourth ratio of said sixth semiconductor region with respect to said fifth semiconductor region; and a fifth region in which said sixth semiconductor region occupies said fifth semiconductor region at a fifth ratio higher than the fourth ratio and which is formed in an annular shape at a circumferential part of said semiconductor base so as to surround said fourth region.

13. A semiconductor device, comprising: a support substrate; a first semiconductor element placed on said support substrate; a second semiconductor element placed on said first semiconductor element; a third semiconductor element formed on said support substrate; and a fourth semiconductor element placed on said third semiconductor element, wherein said first semiconductor element and said third semiconductor element each comprise a semiconductor base which comprises: a first semiconductor region of a first conductivity type; a second semiconductor region of a second conductivity type formed in a surface region of said first semiconductor region; and a third semiconductor region of the first conductivity type formed in a surface region of said second semiconductor region, and each said semiconductor base comprises: a first region formed at a center part of said semiconductor base with a first ratio of said third semiconductor region with respect to said second semiconductor region; and a second region in which said third semiconductor region occupies said second semiconductor region at a second ratio higher than the first ratio and which is formed at a circumferential part of said semiconductor base so as to surround said first region.

wherein said first ratio and said second ratio, each, is a ratio of a surface area of said third semiconductor region to a surface area of said second semiconductor region.

14. The semiconductor device according to claim 13, wherein said first region of said first semiconductor element is formed in a region where said second semiconductor element is placed, and said first region of said third semiconductor element is formed in a region where said fourth semiconductor element is placed.

15. The semiconductor device according to claim 13, wherein a heat radiation layer is formed between said first semiconductor element and said second semiconductor element, and between said third semiconductor element and said fourth semiconductor element.

16. The semiconductor device according to claim 13, wherein a semiconductor element for a controlling purpose is further formed on said support substrate, and said first semiconductor element and said fourth semiconductor element, and said second semiconductor element and said third semiconductor element are switched alternately by said semiconductor element for the controlling purpose.

17. A semiconductor device, comprising: a first semiconductor element placed on a support substrate; and a second semiconductor element placed on said first semiconductor element and having a semiconductor region which faces a semiconductor region of said first semiconductor element, wherein at least one of said first semiconductor element and said second semiconductor element comprises in said semiconductor region: a first semiconductor region of a first conductivity type; a second semiconductor region of a second conductivity type formed in a surface region of said first semiconductor region; and a third semiconductor region of the first conductivity type formed in a surface region of said second semiconductor region, and said at least one semiconductor element comprises: a first region in which said third semiconductor region occupies said second semiconductor region at a first ratio and which is formed at a center part of said semiconductor region; and a second region in which said third semiconductor region occupies said second semiconductor region at a second ratio higher than the first ratio and which is formed at a circumferential part of said semiconductor region so as to surround said first region, wherein said first ratio and said second ratio, each, is a ratio of a surface area of said third semiconductor region to a surface area of said second semiconductor region.

18. A semiconductor device, comprising a plurality of semiconductor elements sequentially stacked on a support substrate, wherein of said plurality of semiconductor elements, each such a semiconductor element as having a semiconductor region which at least partially faces an adjoining semiconductor element comprises in said semiconductor region; a first semiconductor region of/a first conductivity type; a second semiconductor region of a second conductivity type formed in a surface region of said first semiconductor region; and a third semiconductor region of the first conductivity type formed in a surface region of said second semiconductor region, and a first region in which said third semiconductor region occupies said second semiconductor region at a first ratio is formed at a center part of said semiconductor region, and a second region in which said third semiconductor region occupies said second semiconductor region at a second ratio higher than the first ratio is formed at a circumferential part of said semiconductor region so as to surround said first region, wherein said first ratio and said second ratio, each, is a ratio of a surface area of said third semiconductor region to a surface area of said second semiconductor region.

* * * * *